(12) United States Patent
Shimotani et al.

(10) Patent No.: US 8,513,096 B2
(45) Date of Patent: Aug. 20, 2013

(54) WAFER DIVIDING METHOD

(75) Inventors: Makoto Shimotani, Ota-Ku (JP); Kazuya Miyazaki, Ota-ku (JP); Hisaki Ikebata, Ota-ku (JP)

(73) Assignee: Disco Corporation, Tokyo (JP)

( * ) Notice: Subject to any disclaimer, the term of this patent is extended or adjusted under 35 U.S.C. 154(b) by 201 days.

(21) Appl. No.: 13/166,984

(22) Filed: Jun. 23, 2011

(65) Prior Publication Data
US 2012/0003816 A1    Jan. 5, 2012

(30) Foreign Application Priority Data

Jun. 30, 2010   (JP) ................................ 2010-149121

(51) Int. Cl.
*H01L 21/78* (2006.01)
(52) U.S. Cl.
USPC .................................. 438/462; 257/E21.599
(58) Field of Classification Search
USPC .................................. 438/462; 257/E21.599
See application file for complete search history.

(56) References Cited

U.S. PATENT DOCUMENTS

| 2005/0058399 A1* | 3/2005 | Nishizawa et al. | 385/39 |
| 2006/0183349 A1* | 8/2006 | Farnworth et al. | 438/792 |
| 2009/0124063 A1* | 5/2009 | Nakamura | 438/463 |

FOREIGN PATENT DOCUMENTS

JP         11-040520      2/1999

* cited by examiner

*Primary Examiner* — Alexander Ghyka
*Assistant Examiner* — Stanetta Isaac
(74) *Attorney, Agent, or Firm* — Greer, Burns & Crain, Ltd.

(57) ABSTRACT

A method of dividing a wafer having devices formed in a plurality of regions demarcated by a plurality of streets formed in a grid pattern on a surface of the wafer, along the streets and into the individual devices. The wafer dividing method includes the steps of: forming grooves from the face side of the wafer along the streets and in a depth corresponding to the finished thickness of the devices; coating the surface of the wafer with an acrylic liquid resin curable by irradiation with UV rays to fill the grooves with the acrylic liquid resin and disposing a protective film on the acrylic liquid resin; performing irradiation with UV rays from the protective film side so as to cure the acrylic liquid resin; grinding the back side of the wafer so as to expose the grooves on the back side and divide the wafer into the individual devices; adhering the back side of the wafer to a surface of an adhesive tape adhered to an annular frame; and peeling the acrylic resin from the surface of the wafer together with the protective film.

8 Claims, 10 Drawing Sheets

WAFER DIVIDING METHOD

BACKGROUND OF THE INVENTION

1. Field of the Invention

The present invention relates to a wafer processing method by which a wafer provided with a plurality of streets in a grid pattern on a surface thereof and provided with devices formed in a plurality of regions demarcated by the plurality of streets is divided along the streets.

2. Description of the Related Art

In a semiconductor device manufacturing process, for example, such devices as ICs and LSIs are formed in a plurality of regions demarcated by planned dividing lines (streets) formed in a grid pattern on a surface of a semiconductor wafer, which has a roughly circular disk-like shape, and the regions provided with the devices are divided along the streets to thereby manufacture the individual semiconductor devices. As the dividing apparatus for dividing the semiconductor wafer, in general, a cutting apparatus is used. In using the cutting apparatus, the semiconductor wafer is cut along the streets by a cutting blade having a thickness of about 30 µm. The semiconductor devices thus divided are respectively packaged, to be used widely for electric apparatuses such as cell phones and personal computers.

In recent years, the electric apparatuses such as cell phones and personal computers have been demanded to be reduced in weight and size, and, for this purpose, there is a demand for thinner semiconductor devices. As a technology for dividing the semiconductor devices with smaller thickness, a dividing technology generally called "dicing before grinding" has been put to practical use. The dicing-before-grinding method is a technology in which cut grooves having a predetermined depth (a depth corresponding to the finished thickness of semiconductor devices) are formed from the face side of the semiconductor wafer along the streets, and thereafter the back side of the semiconductor wafer provided with the cut grooves on the face side is ground to expose the cut grooves, thereby dividing the semiconductor wafer into the individual semiconductor devices; by this technology, the semiconductor devices can be processed to a thickness of 50 µm or below (see, for example, Japanese Patent Laid-open No. Hei 11-40520).

SUMMARY OF THE INVENTION

When the technology is used in which the cut grooves having a predetermined depth (a depth corresponding to the finished thickness of semiconductor devices) are formed from the face side of a wafer along the streets by the so-called dicing-before-grinding method and thereafter the back side of the wafer is ground to expose the cut grooves and thereby to divide the wafer into the individual devices, there would arise a problem that restraining forces acting on the devices are lost instantaneously upon division of the wafer into the individual devices, and the devices are minutely oscillated with the result of chipping of corners of the devices, leading to lowered device quality. Besides, when grinding of the back side of the wafer is continued until a wafer thickness is reduced to the finished thickness of devices after the division of the wafer into the individual devices, chipping of corners of the devices would be generated, leading to lowered device quality.

Accordingly, it is an object of the present invention to provide a wafer dividing method by which a wafer can be divided into individual devices using the so-called dicing-before-grinding method without causing chipping of corners of the devices.

In accordance with an aspect of the present invention, there is provided a method of dividing a wafer having devices formed respectively in a plurality of regions demarcated by a plurality of streets formed in a grid pattern on a surface of the wafer, along the streets and into the individual devices, the method including: a groove forming step of forming grooves from a face side of the wafer along the streets, the grooves having a depth corresponding to a finished thickness of the devices; an acrylic liquid resin curing step of coating a surface of the wafer having undergone the groove forming step with an acrylic liquid resin curable by irradiation with UV rays so as to fill the grooves with the acrylic liquid resin, disposing a protective film on the acrylic liquid resin, and performing irradiation with UV rays from the protective film side so as to cure the acrylic liquid resin; a wafer dividing step of grinding a back side of the wafer having undergone the acrylic liquid resin curing step so as to expose the grooves on the back side and to divide the wafer into the individual devices; a wafer supporting step of adhering the back side of the wafer having undergone the wafer dividing step to a surface of an adhesive tape having a peripheral portion adhered to an annular frame; and a protective film peeling step of peeling the cured acrylic resin together with the protective film from the surface of the wafer adhered to the surface of the adhesive tape.

Preferably, the protective film is composed of an acrylic resin film. Alternatively, the protective film may be composed of a film of a resin other than acrylic resin, with the surface of the film having undergone an acrylic treatment. Preferably, the grooves formed by the groove forming step are set to have a width of not less than half the depth corresponding to the finished thickness of the devices.

In the wafer dividing method according to the present invention, the grooves having a depth corresponding to the finished thickness of devices are formed from the face side of the wafer along the streets, a surface of the wafer is coated with an acrylic liquid resin curable by irradiation with UV rays so as to fill the grooves with the acrylic liquid resin, the protective film is disposed on the acrylic liquid resin, irradiation with UV rays from the protective side is performed to cure the acrylic liquid resin, and then the back side of the wafer is ground so as to expose the grooves on the back side and to divide the wafer into the individual devices. This ensures that even after the wafer is divided into the individual devices, the grooves are filled with the acrylic resin which is in the cured state. Therefore, even when the wafer is divided into the devices, the devices are kept in the state of being restrained by the acrylic resin filling the grooves. Accordingly, minute oscillation of the devices is not generated, so that chipping of the devices due to minute oscillation can be prevented from occurring.

Besides, in the wafer dividing method according to the present invention, the back side of the wafer having undergone the wafer dividing step is adhered to a surface of the adhesive tape having a peripheral portion adhered to the annular frame, and thereafter the cured acrylic resin is peeled from the surface of the wafer together with the protective film. Therefore, the acrylic resin filling the grooves can also be removed simultaneously with the peeling of the cured acrylic resin.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
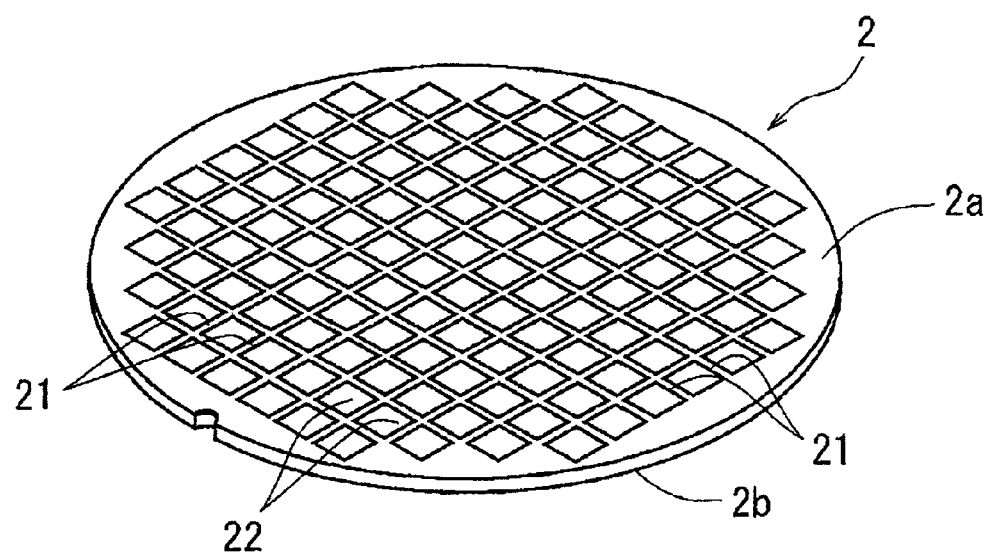
FIG. 1 is a perspective view of a semiconductor wafer to be divided by the wafer dividing method according to the present invention.

Now, preferred embodiments of the wafer dividing method according to the present invention will be described in detail below referring to the accompanying drawings. FIG. 1 shows a perspective view of a semiconductor wafer as a wafer. The semiconductor wafer 2 shown in FIG. 1 is composed, for example, of a silicon wafer having a thickness of 700 µm, with a plurality of streets 21 formed in a grid pattern on a face-side surface 2a thereof. In addition, on the face-side surface 2a of the semiconductor wafer 2, devices 22 such as ICs and LSIs are formed respectively in the regions demarcated by the plurality of streets 21 formed in the grid pattern. Hereafter, a method of dividing the semiconductor wafer 2 into individual semiconductor devices will be described.

For dividing the semiconductor wafer 2 into the individual semiconductor devices, first, grooves having a predetermined depth (a depth corresponding to a finished thickness of the devices) is formed along the streets 21 formed on the face-side surface 2a of the semiconductor wafer 2 (groove forming step). The groove forming step is carried out by use of a cutting apparatus 3 shown in FIG. 2. The cutting apparatus 3 shown in FIG. 2 includes a chuck table 31 for holding a work, a cutting means 32 for cutting the work held on the chuck table 31, and an imaging means 33 for picking up an image of the work held on the chuck table 31. The chuck table 31 is configured so as to hold the work by suction. In addition, the chuck table 31 is configured to be moved in a machining feed direction indicated by an arrow X in FIG. 2 by a cutting feeding means (not shown) and to be moved in an indexing feeding direction indicated by an arrow Y by an indexing feeding means (not shown).

The cutting means 32 includes a spindle housing 321 disposed to be substantially horizontal, a rotating spindle 322 rotatably supported on the spindle housing 321, and a cutting blade 323 mounted to a tip portion of the rotating spindle 322, wherein the rotating spindle 322 is rotated in the direction indicated by an arrow A by a servo motor (not shown) disposed inside the housing 321. Incidentally, the thickness of the cutting blade 323 is set at 30 µm in the embodiment shown. Accordingly, the width of the cut grooves which are cut by the cutting blade 323 is 30 µm.

Figure 2:
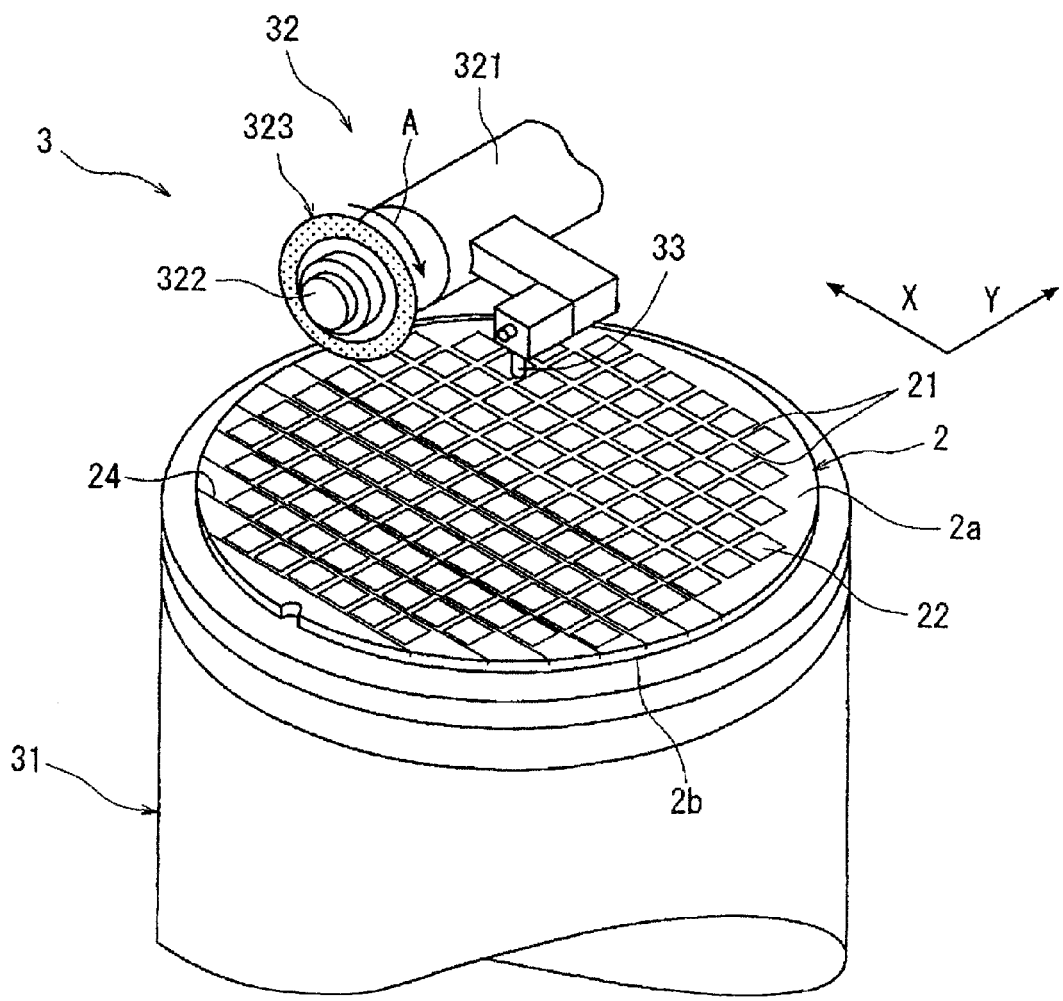
FIG. 2 is a perspective view of a major part of a cutting apparatus with which to carry out a cut groove forming step in the wafer dividing method according to the invention.

In carrying out the groove forming step by the cutting apparatus 3 shown in FIG. 2, a semiconductor wafer 2 is mounted on the chuck table 31, with the back-side surface 2b down. Then, a suction means (not shown) is operated to hold the semiconductor wafer 2 on the chuck table 31 by suction. Accordingly, the semiconductor wafer 2 held on the chuck table 31 has its face-side surface 2a on the upper side. The chuck table 31 with the semiconductor wafer 2 sucked and held thereon in this manner is positioned into a position directly under the imaging means 33 by the cutting feeding means (not shown).

After the chuck table 31 is thus positioned directly under the imaging means 33, an alignment operation of detecting a cutting region to be cut of the semiconductor wafer 2 is performed by the imaging means 33 and a control means (not shown). Specifically, the imaging means 33 and the control means (not shown) carry out image processing such as pattern matching for aligning between the cutting blade 323 and the street 21 formed in a first direction of the semiconductor wafer 2, thereby achieving alignment of the cutting region (alignment step). In addition, alignment of the cutting region is performed in the same manner also for the planned dividing line 21 formed on the semiconductor wafer 2 and extending perpendicularly to the first direction.

Figure 3A:
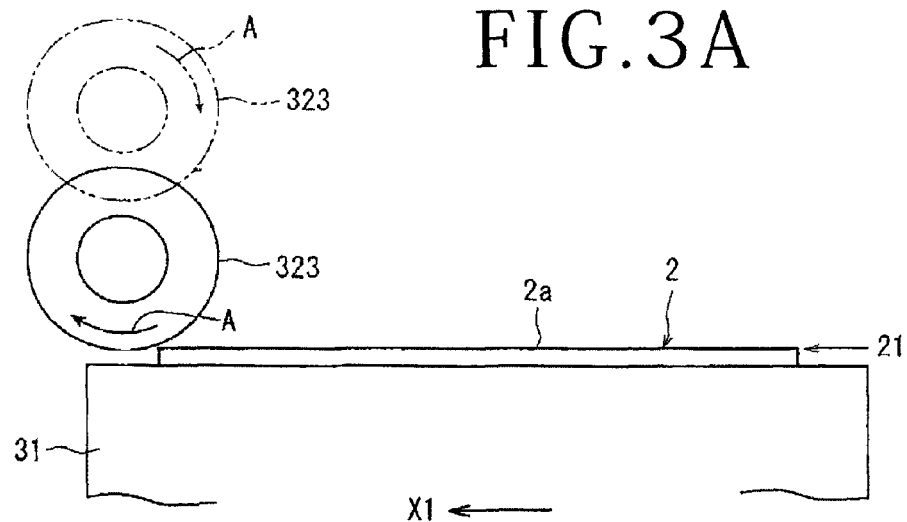
FIGS. 3A and 3B illustrate a groove forming step in the wafer dividing method according to the invention.

After the alignment of the cutting region of the semiconductor wafer 2 held on the chuck table 31 is conducted in the above-mentioned manner, the chuck table 31 holding the semiconductor wafer 2 thereon is moved to a cutting start position of the cutting region. Then, as shown in FIG. 3A, the semiconductor wafer 2 is so positioned that one end (the left end in FIG. 3A) of the street 21 to be cut of the semiconductor wafer 2 is located a predetermined amount on the right side relative to a position directly under the cutting blade 323 (machining feed start position positioning step). After the semiconductor wafer 2 is positioned at the machining start position of the machining region in this manner, the cutting blade 323 in the state of being rotated in the direction indicated by the arrow A is subjected to downward cutting-in feed from a stand-by position indicated by a two-dotted chain line in FIG. 3A, and is positioned in a predetermined cutting-in feed position as indicated by a solid line in FIG. 3A. As shown in FIG. 3A, the cutting-in feed position is so set that the lower end of the outer peripheral edge of the cutting blade 323 is located at a position spaced by, for example, 50 µm from the face-side surface 2a (upper surface) of the semiconductor wafer 2. Incidentally, the relationship between the cutting-in depth of the cutting blade 323 and the width of the groove to be formed by the cutting blade 323 is desirably so set that the width of the groove is not less than half the depth corresponding to the finished thickness of the devices.

Figure 3B:
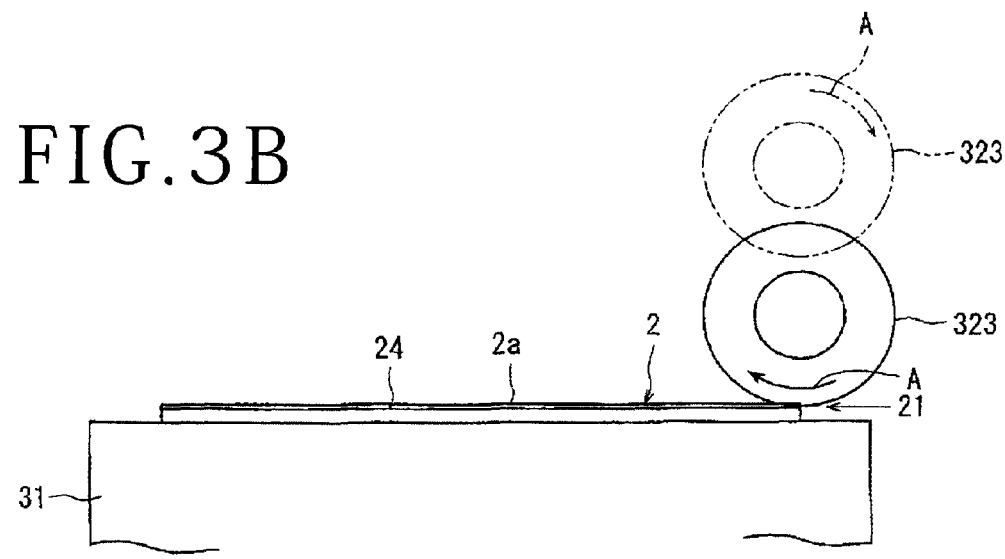
Figure 3C:
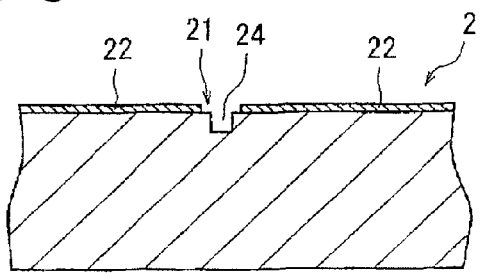
FIG. 3C is a sectional view of the wafer provided with the grooves.

Next, as shown in FIG. 3A, while rotating the cutting blade 323 at a predetermined rotating speed in the direction indicated by the arrow A, the chuck table 31 is subjected to machining feed at a predetermined machining feed rate in the direction indicated by an arrow X1 in FIG. 3A (groove forming step). As a result, as shown in FIGS. 3B and 3C, the semiconductor wafer 2 is formed with a cut groove 24 having a depth of 50 µm and a width of 30 µm along the street 21. This groove forming step is carried out along all the streets 21 formed on the semiconductor wafer 2.

Figure 4A:
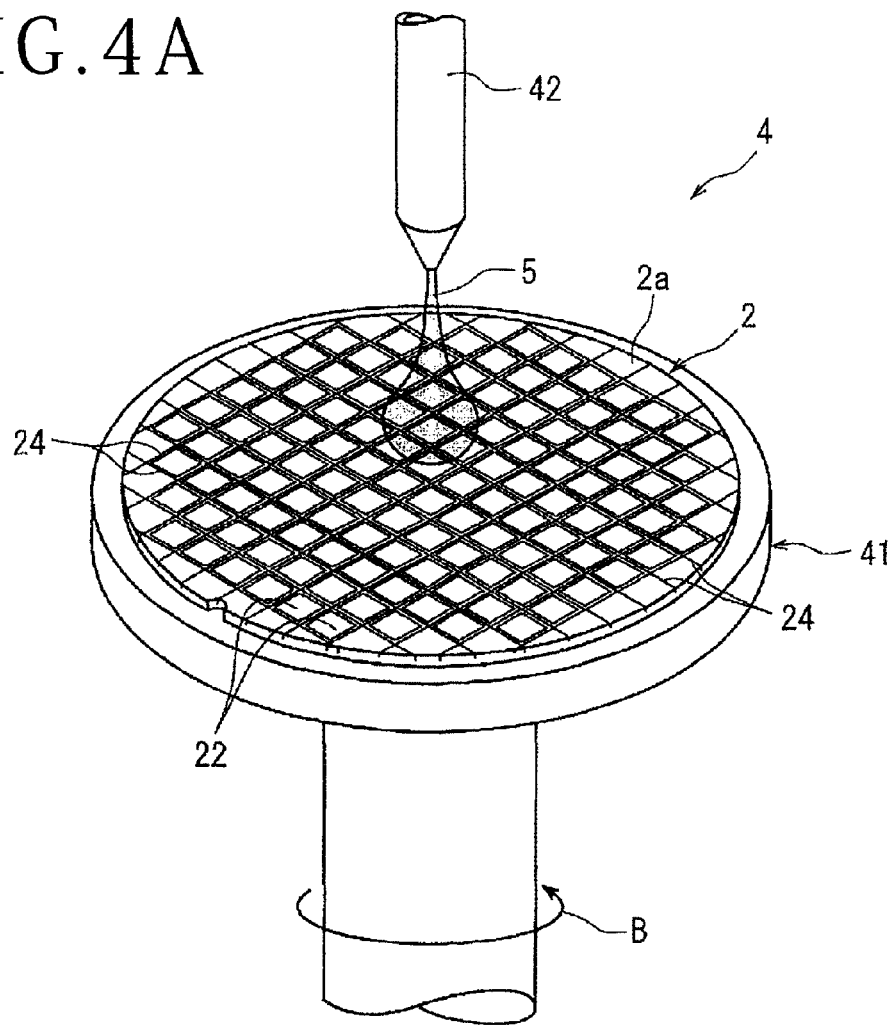
FIGS. 4A and 4B illustrate an acrylic liquid resin applying step in an acrylic liquid resin curing step in the wafer dividing method according to the invention.

After the above-mentioned groove forming step is conducted, an acrylic liquid resin curing step is carried out in which the face-side surface of the semiconductor wafer 2 is coated with an acrylic liquid resin curable by irradiation with UV rays so as to fill the grooves 24 with the acrylic liquid resin, a protective film is disposed on the acrylic liquid resin, and irradiation with UV rays from the protective film side is conducted to cure the acrylic liquid resin. For conducting the acrylic liquid resin curing step, first, an acrylic liquid resin applying step is carried out in which the face-side surface of the semiconductor wafer 2 is coated with the acrylic liquid resin curable by irradiation with UV rays so as to fill the grooves 24 with the acrylic liquid resin. In this embodiment, the acrylic liquid resin applying step is carried out by a spin coater 4 as shown in FIG. 4A. The spin coater 4 shown in FIG. 4A includes a chuck table 41 provided with a suction holding means, and a nozzle 42 disposed on the upper side of a central portion of the chuck table 41. The semiconductor wafer 2 having undergone the above-mentioned groove forming step is mounted on the chuck table 41 of the spin coater 4, with the back-side surface down, and a suction means (not shown) is operated to thereby hold the semiconductor wafer 2 on the spin coater 4 by suction. Accordingly, the semiconductor wafer 2 held on the spin coater 4 has its face-side surface 2a on the upper side.

Figure 4B:
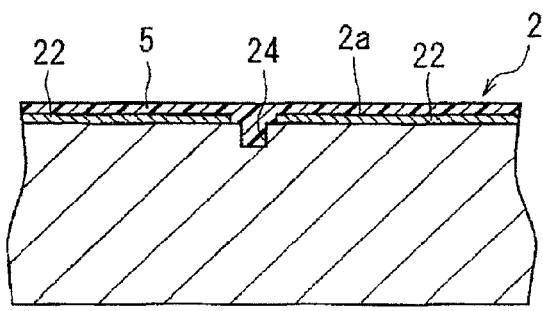

Subsequently, while rotating the chuck table 41 in the direction indicated by an arrow B, an acrylic liquid resin 5 curable by irradiation with UV rays is dropped from the nozzle 42 onto a central portion of the face-side surface of the semiconductor wafer 2. This results in that the acrylic liquid resin 5 flows under a centrifugal force toward an outer peripheral area to coat the face-side surface 2a of the semiconductor wafer 2, and fills the grooves 24 formed in the surface of the semiconductor wafer 2. Incidentally, as the acrylic liquid resin, "Rejirokku" (product name) manufactured and sold by ThreeBond Co., Ltd. can be used. With the acrylic liquid resin applying step thus conducted, as shown in FIG. 4B, a coating film of the acrylic liquid resin 5 is formed on the face-side surface 2a of the semiconductor wafer 2, and the grooves 24 are filled with the acrylic liquid resin 5.

Figure 5A:
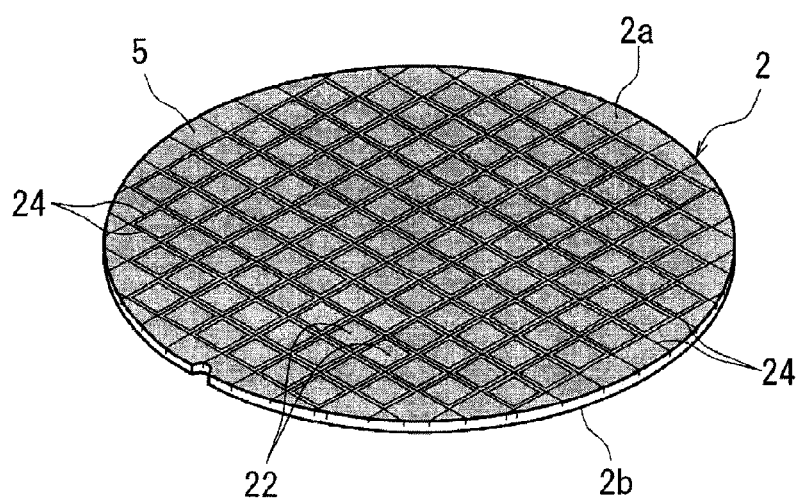
FIGS. 5A and 5B illustrate a protective film disposing step in the acrylic liquid resin curing step in the wafer dividing method according to the invention.
Figure 5B:
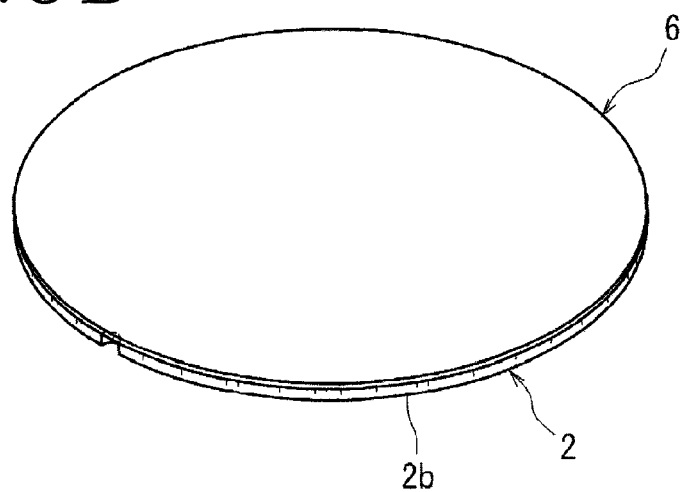
Figure 6A:
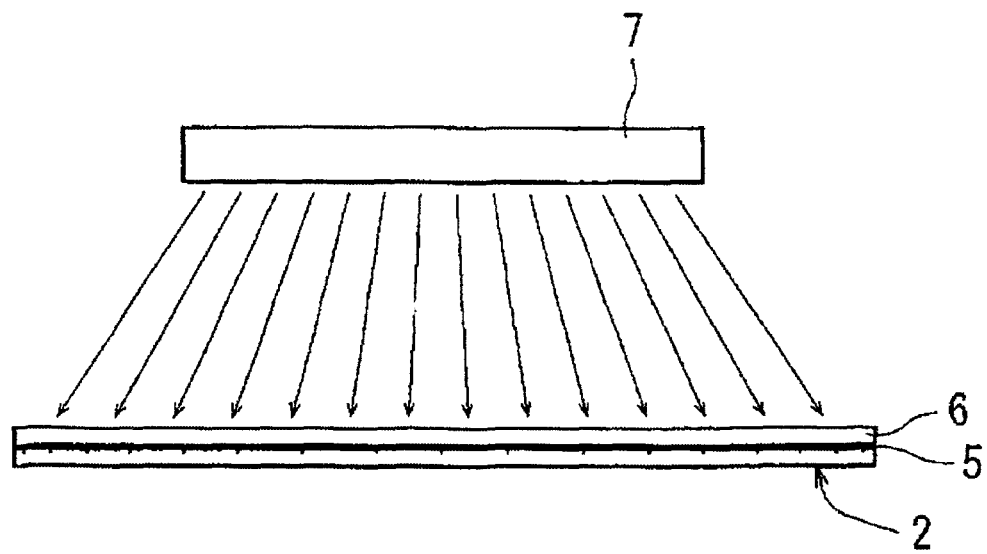
FIGS. 6A and 6B illustrate the acrylic liquid resin curing step in the wafer dividing method according to the invention.
Figure 6B:
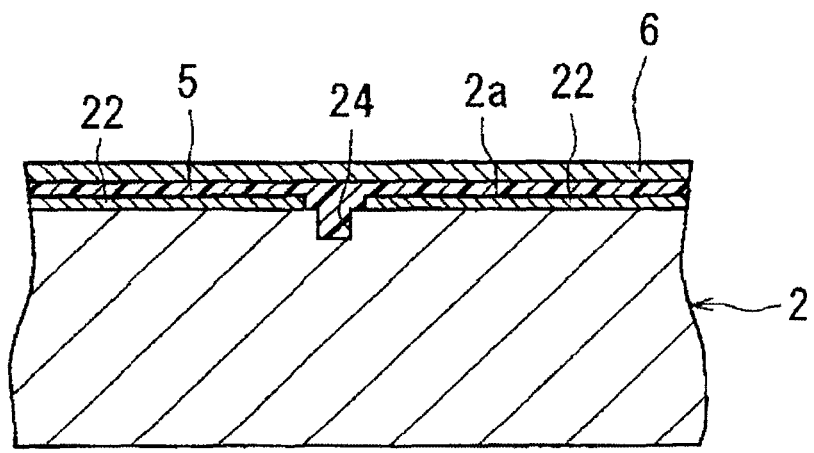

Next, a protective film is disposed on the surface of the coating film of the acrylic liquid resin 5 applied to the face-side surface 2a of the semiconductor wafer 2, and an acrylic liquid resin curing step is carried out in which irradiation with UV rays from the protective film side is conducted so as to cure the acrylic liquid resin. Specifically, as shown in FIGS. 5A and 5B, the protective film 6 is disposed on the surface of the coating film of the acrylic liquid resin 5 applied to the face-side surface 2a of the semiconductor wafer 2 (protective film disposing step). Desirably, as the protective film 6, an acrylic resin film formed of a material which is the same kind as and having affinity for the acrylic liquid resin is used; or, alternatively, there is used a film of a resin other than acrylic resin, for example, a film of a polyethylene terephthalate (PET) resin having its surface (the surface made to face the acrylic liquid resin film 5) subjected to an acrylic treatment. Incidentally, the acrylic treatment can be conducted by use of "Acrylic Primer" (product name) manufactured and sold by Tilement Co., Ltd. Thus, in the embodiment shown in the drawings, the acrylic resin film or acrylic-treated protective film 6 having affinity for the acrylic liquid resin is disposed on the surface of the coating film of the acrylic liquid resin 5 applied to the face-side surface 2a of the semiconductor wafer 2, whereby good adhesion is secured between the protective film 6 and the coating film of the acrylic liquid resin 5. Next, as shown in FIG. 6A, irradiation with UV rays from the protective film 6 side is conducted by use of a UV irradiation apparatus 7. Consequently, as shown in FIG. 6B, the acrylic liquid resin 5 is cured and firmly adhered to the surface (lower surface) of the protective film 6.

Figure 7:
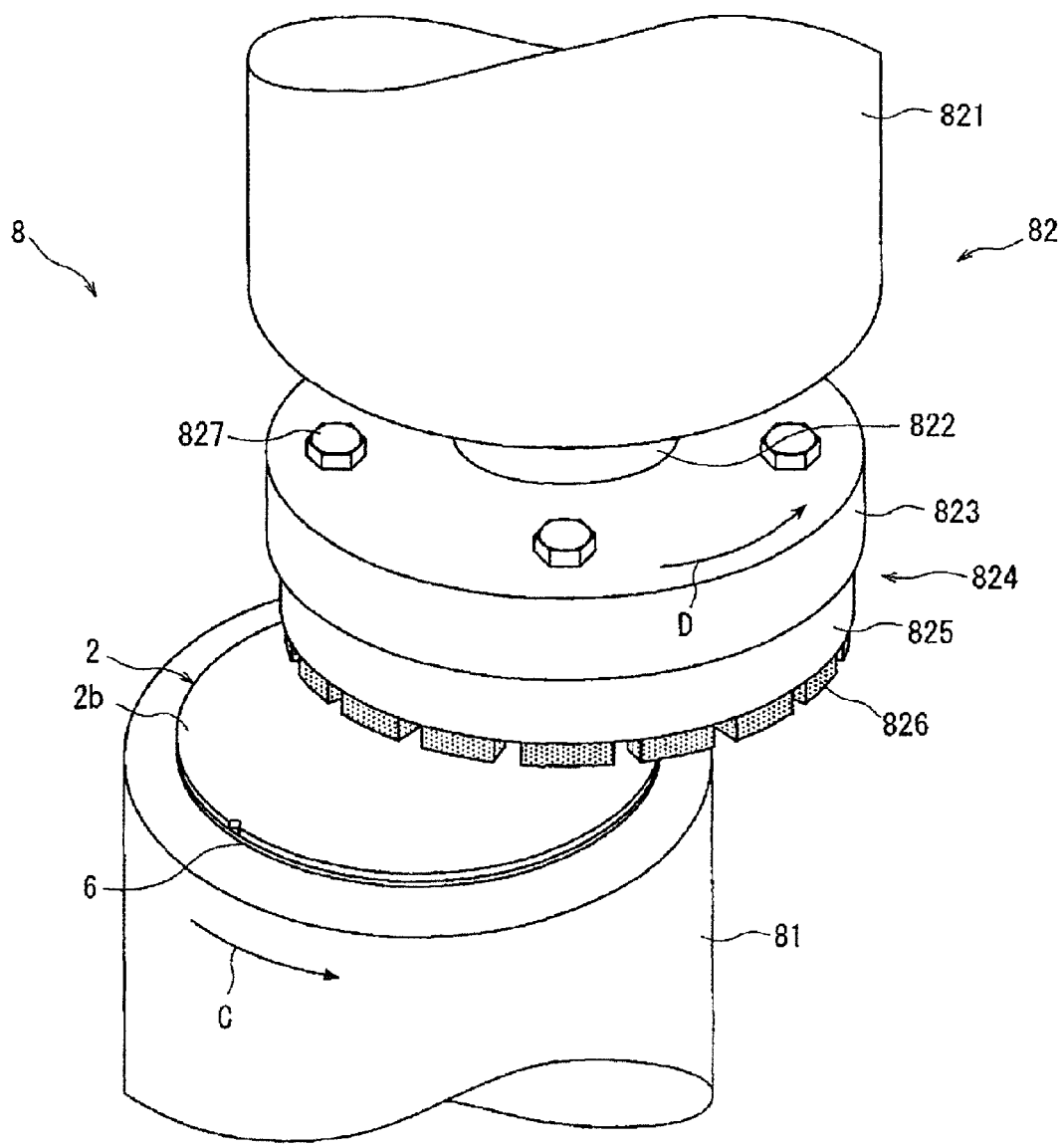
FIG. 7 illustrates a wafer dividing step in the wafer dividing method according to the invention.
Figure 8A:
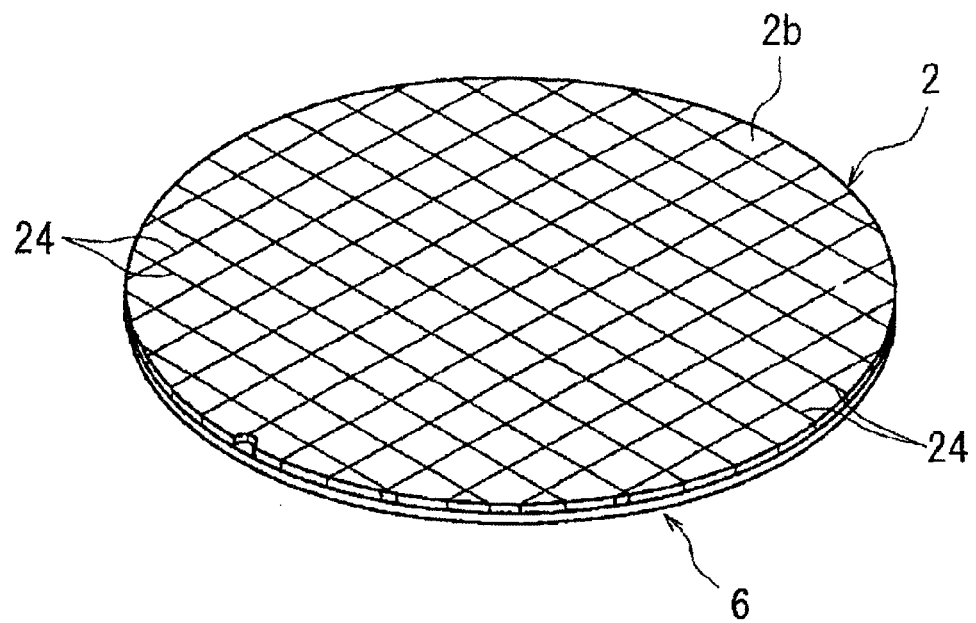
FIG. 8A is a perspective view of the wafer having undergone the wafer dividing step shown in FIG. 7.
Figure 8B:
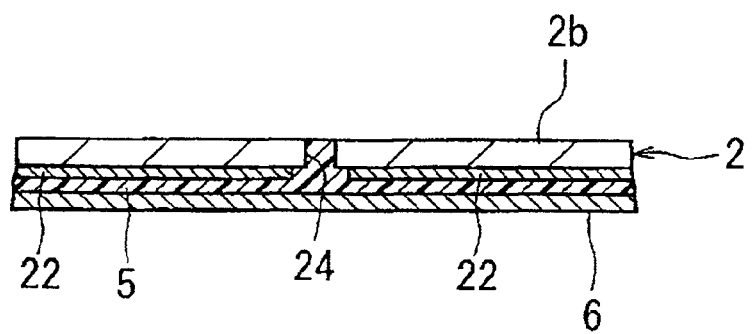
FIG. 8B is a sectional view showing a major part of the wafer.
Figure 9:
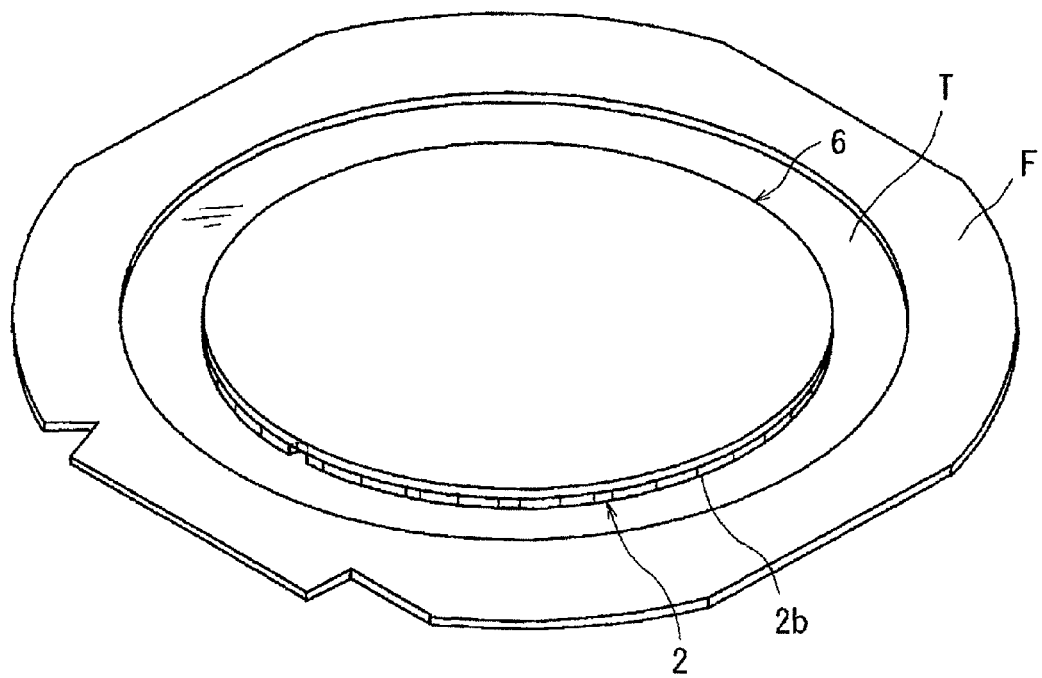
FIG. 9 illustrates a wafer supporting step in the wafer dividing method according to the invention.

After the above-mentioned acrylic liquid resin curing step is conducted, a wafer dividing step is carried out in which the back side of the semiconductor wafer 2 is ground so as to expose the grooves 24 and to divide the semiconductor wafer 2 into individual devices. This wafer dividing step is performed by use of a grinding apparatus shown in FIG. 7. The grinding apparatus 8 shown in FIG. 7 includes a chuck table 81 for holding the work, and a grinding means 82 for grinding a work surface of the work held on the chuck table 81. The chuck table 81, with the work held on its upper surface by suction, is rotated in the direction indicated by an arrow C in FIG. 7. The grinding means 82 includes a spindle housing 821, a rotating spindle 822 rotatably supported on the spindle housing 821 and rotated by a rotational driving mechanism (not shown), a mounter 823 attached to the lower end of the rotating spindle 822, and a grinding wheel 824 mounted to a lower surface of the mounter 823. The grinding wheel 824 includes a circular disk-shaped base 825 and grindstones 826 mounted in an annular pattern on a lower surface of the base 825. The base 825 is mounted to the lower surface of the mounter 823 by fastening bolts 827.

For performing the wafer dividing step by use of the above-mentioned grinding apparatus 8, the semiconductor wafer 2 having undergone the above-mentioned acrylic liquid resin curing step is mounted on the upper surface (holding surface) of the chuck table 81, in such a manner that the protective film 6 adhered to the face-side surface 2a thereof is on the lower side, and a suction means (not shown) is operated so as to hold the semiconductor wafer 2 on the chuck table 81 through the protective film 6 by suction. Accordingly, the semiconductor wafer 2 held on the chuck table 81 through the protective film 6 by suction has its back-side surface 2b on the upper side. After the semiconductor wafer 2 is thus held on the chuck table 81 by suction, the chuck table 81 is rotated in the direction indicated by the arrow C at, for example, 300 rpm, and the grinding wheel 824 of the grinding means 82 is rotated in the direction of an arrow D at, for example, 6000 rpm, making in contact with the back-side surface 2b of the semiconductor wafer 2. While keeping these rotations, the grinding wheel 824 is put into downward grinding feed at a grinding feed rate of, for example, 1 μm/sec, to grind the back-side surface 2b of the semiconductor wafer 2, thereby reducing the thickness of the semiconductor wafer 2 down to 50 μm, for example. Therefore, the grooves 24 are exposed at the back-side surface 2b. As a result, the semiconductor wafer 2 is divided into the individual devices. Even when the grooves 24 are exposed at the back-side surface 2b in this manner, the condition where the grooves 24 are filled with the cured product of the acrylic liquid resin 5 is maintained. Therefore, even after the semiconductor wafer 2 is divided into the individual devices, the devices are kept in the state of being restrained (or bound) by the acrylic resin filling the grooves 24. Accordingly, minute oscillation of the devices would not be generated, so that the devices can be prevented from chipping due to minute oscillation.

Next, a wafer supporting step is carried out in which the back side of the semiconductor wafer 2 having undergone the above-mentioned wafer dividing step is adhered to an adhesive tape which has its outer peripheral portion adhered to an annular frame. Specifically, the back-side surface 2b of the semiconductor wafer 2 is adhered to the surface of the adhesive tape T of which an outer peripheral surface is adhered to the annular frame F in such a manner as to cover an inside opening of the annular frame F. Consequently, the protective film 6 mounted to the face side of the semiconductor wafer 2 adhered to the surface of the adhesive tape T is set on the upper side.

Figure 10:
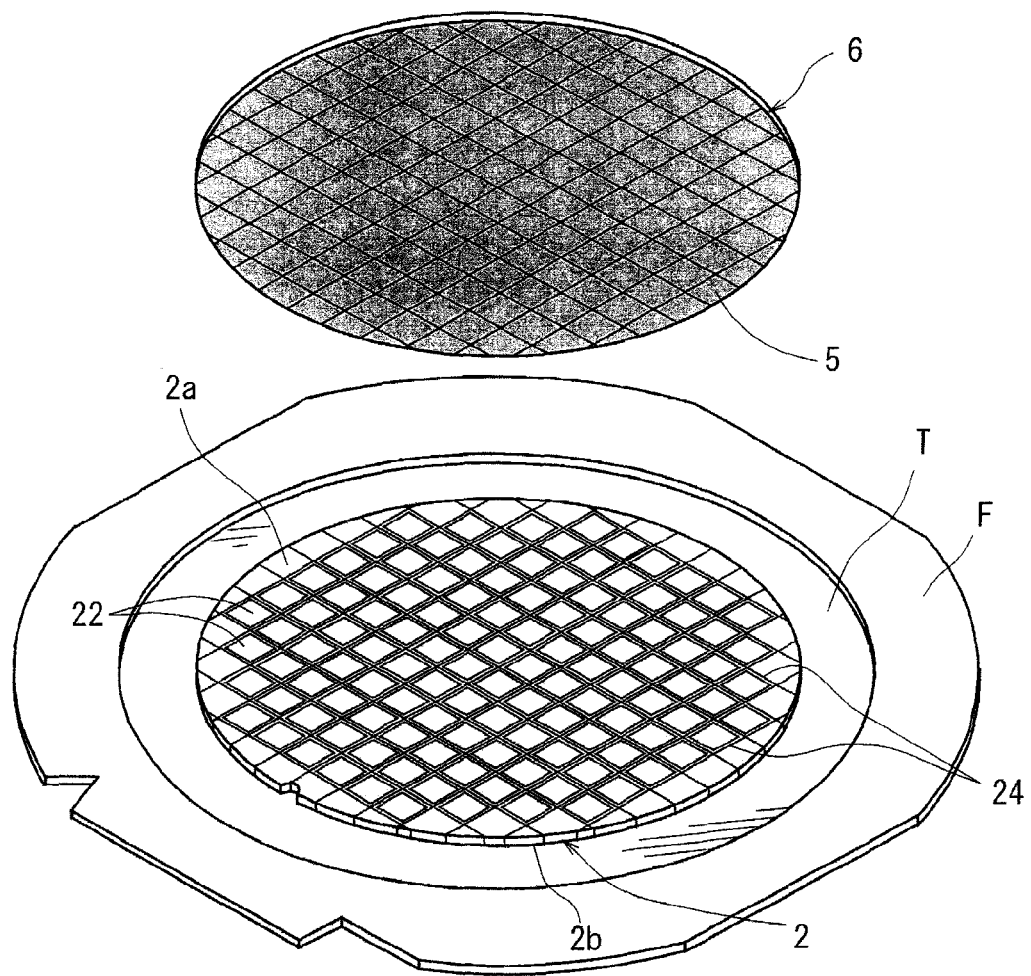
FIG. 10 illustrates a protective film peeling step in the wafer dividing method according to the invention.

After the above-mentioned wafer supporting step is performed, a protective film peeling step is carried out in which the cured acrylic resin is peeled together with the protective film from the surface of the wafer adhered to the surface of the adhesive tape. To be more specific, as shown in FIG. 10, the protective film 6 mounted to the surface of the semiconductor wafer 2 adhered to the surface of the adhesive tape T whose outer peripheral portion is adhered to the annular frame F is peeled off. Since the cured acrylic resin 5 is firmly adhered to the protective film 6, the peeling of the protective film 6 results in that the acrylic resin 5 coating the surface of the semiconductor wafer 2 and filling the grooves 24 is peeled off together with the protective film 6. In this instance, since the grooves 24 filled with the acrylic resin are set to have a width of not less than half the depth corresponding to the finished thickness of the devices as above-mentioned, the acrylic resin filling the grooves 24 can also be removed easily. When the cured acrylic resin 5 is thus peeled from the surface of the semiconductor wafer 2, contaminants adhering to the surface of the semiconductor wafer 2 and wall surfaces of the grooves 24 are also removed. Incidentally, the just-mentioned protective film peeling step is desirably carried out in the condition where the semiconductor wafer 2 is mounted on the chuck table, with the adhesive tape T adhered to the back-side surface of the semiconductor wafer 2 being set on the lower side, and where the semiconductor wafer 2 is sucked and held on the chuck table through the adhesive tape T.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of dividing a wafer having devices formed respectively in a plurality of regions demarcated by a plurality of streets formed in a grid pattern on a surface of the wafer, along the streets and into the individual devices, the method comprising:

a groove forming step of forming grooves from a face side of the wafer along the streets, the grooves having a depth corresponding to a finished thickness of the devices;

an acrylic liquid resin curing step of coating a surface of the wafer having undergone the groove forming step with an acrylic liquid resin curable by irradiation with UV rays so as to fill the grooves with the acrylic liquid resin, disposing a protective film on the acrylic liquid resin, wherein the protective film has an upper surface and a lower surface, and performing irradiation with UV rays from the protective film side so as to cure the acrylic liquid resin and adhere an upper surface of the acrylic liquid resin to the lower surface of the protective film;

a wafer dividing step of grinding a back side of the wafer having undergone the acrylic liquid resin curing step so as to expose the grooves on the back side and to divide the wafer into the individual devices;

a wafer supporting step of adhering the back side of the wafer having undergone the wafer dividing step to a surface of an adhesive tape having a peripheral portion adhered to an annular frame; and a protective film peeling step of peeling the cured acrylic resin together with the protective film from the surface of the wafer when the wafer is adhered to the surface of the adhesive tape.

2. The wafer dividing method according to claim 1, wherein the protective film is composed of an acrylic resin film.

3. The wafer dividing method according to claim 1, wherein the protective film is composed of a film of a resin other than acrylic resin with the lower surface of the film having undergone an acrylic treatment.

4. The wafer dividing method according to claim 1, wherein the grooves formed by the groove forming step are set to have a width of not less than half the depth corresponding to the finished thickness of the devices.

5. The wafer dividing method according to claim 1, wherein the coating of the surface of the wafer with the acrylic liquid resin is performed by rotating the wafer such that centrifugal force causes the acrylic liquid resin to flow towards the outer peripheral areas of the wafer.

6. The wafer dividing method according to claim 1, wherein the protective film is disk-shaped prior to being disposed on the acrylic liquid resin.

7. The wafer dividing method according to claim 1, wherein the protective film is composed of a polyethylene terephtalate resin, and further wherein the lower surface of the protective film has undergone an acrylic treatment prior to being disposed on the acrylic liquid resin.

8. The wafer dividing method according to claim 1, wherein the protective film peeling step results in a generally disk-shaped member comprised of the protective film and the acrylic resin being removed from the wafer.

* * * * *